United States Patent
Liu et al.

(10) Patent No.: US 10,818,556 B2
(45) Date of Patent: Oct. 27, 2020

(54) METHOD FOR FORMING A SEMICONDUCTOR STRUCTURE

(71) Applicant: UNITED MICROELECTRONICS CORP., Hsin-Chu (TW)

(72) Inventors: Hao-Yeh Liu, Kaohsiung (TW); Jia-Feng Fang, Changhua County (TW); Yu-Hsiang Lin, New Taipei (TW); Ching-Hsiang Chiu, Yilan County (TW); Chia-Wei Liu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 31 days.

(21) Appl. No.: 16/223,036

(22) Filed: Dec. 17, 2018

(65) Prior Publication Data

US 2020/0194313 A1    Jun. 18, 2020

(51) Int. Cl.
| | | |
|---|---|---|
| H01L 29/00 | (2006.01) | |
| H01L 21/8234 | (2006.01) | |
| H01L 21/762 | (2006.01) | |
| H01L 21/3105 | (2006.01) | |
| H01L 21/02 | (2006.01) | |
| H01L 21/311 | (2006.01) | |
| H01L 29/66 | (2006.01) | |
| H01L 27/088 | (2006.01) | |
| H01L 29/78 | (2006.01) | |
| H01L 21/027 | (2006.01) | |

(52) U.S. Cl.
CPC .. *H01L 21/823431* (2013.01); *H01L 21/0228* (2013.01); *H01L 21/02233* (2013.01); *H01L 21/3105* (2013.01); *H01L 21/31053* (2013.01); *H01L 21/31111* (2013.01); *H01L 21/76224* (2013.01); *H01L 21/823481* (2013.01); *H01L 27/0886* (2013.01); *H01L 29/66795* (2013.01); *H01L 29/785* (2013.01); *H01L 21/0274* (2013.01)

(58) Field of Classification Search
CPC ....... H01L 21/823431; H01L 29/66795; H01L 27/0886; H01L 29/785; H01L 29/6681; H01L 21/823481
See application file for complete search history.

(56) References Cited

U.S. PATENT DOCUMENTS

| | | | | |
|---|---|---|---|---|
| 8,617,996 B1 * | 12/2013 | Chi | ...................... | H01L 21/308 438/700 |
| 8,658,536 B1 * | 2/2014 | Choi | ..................... | H01L 21/308 438/699 |

(Continued)

*Primary Examiner* — Mounir S Amer
*Assistant Examiner* — Alexander Belousov
(74) *Attorney, Agent, or Firm* — Winston Hsu

(57) ABSTRACT

A method for forming a semiconductor structure is provided. Multiple fins extending along a first direction are formed in a semiconductor substrate. The multiple fins includes a group of active fins, a pair of protection fins sandwiching about the group the active fins, and at least one dummy fin around the pair of protection fins. A fin cut process is performed to remove the at least one dummy fin around the pair of protection fins. After performing the fin cut process, trench isolation structures are formed within the trenches between the multiple fins. The trench isolation structures are subjected to an anneal process. After annealing the trench isolation structures, the pair of protection fins is removed.

11 Claims, 4 Drawing Sheets

(56) References Cited

U.S. PATENT DOCUMENTS

| | | | | |
|---|---|---|---|---|
| 8,753,940 | B1* | 6/2014 | Wei | H01L 21/845 438/283 |
| 9,147,612 | B2* | 9/2015 | Huang | H01L 29/66795 |
| 9,190,496 | B2* | 11/2015 | Lin | H01L 29/401 |
| 9,263,287 | B2 | 2/2016 | Tsao | |
| 9,263,340 | B2* | 2/2016 | Taylor, Jr. | H01L 21/823431 |
| 9,299,843 | B2 | 3/2016 | Wang | |
| 9,318,488 | B2* | 4/2016 | Wu | H01L 29/785 |
| 9,385,123 | B2* | 7/2016 | Chen | H01L 29/0653 |
| 9,391,174 | B1* | 7/2016 | Sung | H01L 21/3083 |
| 9,455,176 | B2* | 9/2016 | Tsao | H01L 29/66795 |
| 9,515,184 | B2* | 12/2016 | Chiang | H01L 27/0886 |
| 9,524,909 | B2* | 12/2016 | Huang | H01L 21/02271 |
| 9,559,192 | B1* | 1/2017 | Lee | H01L 29/6681 |
| 9,722,024 | B1* | 8/2017 | Xie | H01L 21/823431 |
| 10,170,591 | B2* | 1/2019 | Chi | H01L 21/823431 |
| 10,276,443 | B2* | 4/2019 | Chen | H01L 29/66795 |
| 10,312,346 | B2* | 6/2019 | Anderson | H01L 29/66666 |
| 10,355,110 | B2* | 7/2019 | Chang | H01L 29/0649 |
| 10,361,125 | B2* | 7/2019 | Xu | H01L 27/1211 |
| 10,431,660 | B2* | 10/2019 | Cheng | H01L 21/76229 |
| 10,475,886 | B2* | 11/2019 | Kanakasabapathy | H01L 21/845 |
| 10,522,409 | B2* | 12/2019 | Tsai | H01L 21/823431 |
| 10,586,713 | B2* | 3/2020 | Zhou | H01L 21/02219 |
| 10,586,859 | B2* | 3/2020 | Wang | H01L 21/3081 |
| 10,615,255 | B2* | 4/2020 | Fan | H01L 21/823431 |
| 2013/0065326 | A1* | 3/2013 | Sudo | H01L 27/228 438/3 |
| 2013/0217204 | A1* | 8/2013 | Park | H01L 21/76283 438/424 |
| 2013/0244387 | A1* | 9/2013 | Cho | H01L 21/823821 438/283 |
| 2013/0309838 | A1* | 11/2013 | Wei | H01L 21/823821 438/424 |
| 2013/0330889 | A1* | 12/2013 | Yin | H01L 27/0924 438/197 |
| 2014/0349482 | A1* | 11/2014 | Tsao | H01L 21/3086 438/690 |
| 2015/0129980 | A1* | 5/2015 | Wang | H01L 29/66795 257/401 |
| 2015/0145065 | A1* | 5/2015 | Kanakasabapathy | H01L 21/823481 257/401 |
| 2015/0279971 | A1* | 10/2015 | Xie | H01L 29/66818 257/401 |
| 2015/0340238 | A1* | 11/2015 | Xie | H01L 29/0649 438/702 |
| 2017/0170174 | A1* | 6/2017 | Chang | H01L 21/823431 |
| 2018/0090491 | A1* | 3/2018 | Huang | H01L 21/76232 |
| 2018/0096999 | A1* | 4/2018 | Zhou | H01L 29/1037 |
| 2020/0194313 | A1* | 6/2020 | Liu | H01L 21/02233 |

* cited by examiner

METHOD FOR FORMING A SEMICONDUCTOR STRUCTURE

BACKGROUND OF THE INVENTION

1. Field of the Invention

The present disclosure relates generally to the field of semiconductor technology. More particularly, the present disclosure relates to a method for forming semiconductor fin structures.

2. Description of the Prior Art

With the process development of semiconductor technology, the structure of semiconductor device has transitioned from 2D planar type devices to 3D fin-type devices. 3D fin-type devices provide many benefits in electrical characteristics. However, the fin structure of a 3D fin-type device is easily impacted by stress in the fabrication processes which induces fin damage, bending, cracking and/or stacking faults.

There is a need in this industry to provide a method for fabricating a 3D fin-type device in order to improve the device performance and product yield.

SUMMARY OF THE INVENTION

It is one object of the present disclosure to provide an improved method for fabricating semiconductor fin structures in order to improve the device performance and product yield.

According to one aspect of the present disclosure, a method for forming a semiconductor structure is provided. Multiple fins extending along a first direction are formed in a semiconductor substrate. The multiple fins includes a group of active fins, a pair of protection fins sandwiching about the group the active fins, and at least one dummy fin around the pair of protection fins. A fin cut process is performed to remove the at least one dummy fin around the pair of protection fins. After performing the fin cut process, trench isolation structures are formed within the trenches between the multiple fins. The trench isolation structures are subjected to an anneal process. After annealing the trench isolation structures, the pair of protection fins is removed.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. Therefore, the following detailed description is not to be considered as limiting, but the embodiments included herein are defined by the scope of the accompanying claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Figure 1:
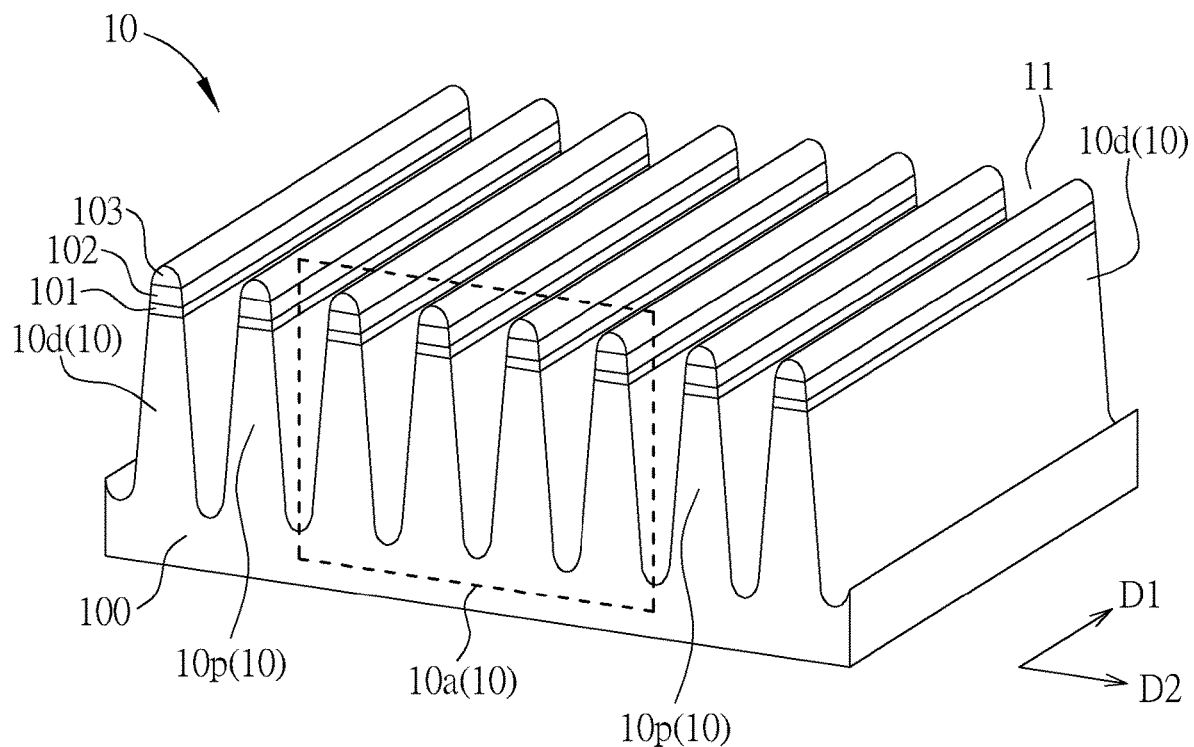
FIG. 1 to FIG. 8 are schematic, perspective diagrams showing a method for forming a semiconductor structure in accordance with one embodiment of the invention.

Please refer to FIG. 1 to FIG. 8. FIG. 1 to FIG. 8 are schematic, perspective diagrams showing a method for forming a semiconductor structure in accordance with one embodiment of the invention. As shown in FIG. 1, first, a semiconductor substrate 10 is provided. For example, the semiconductor substrate 10 may be a bulk silicon substrate, but is not limited thereto. In some embodiments, the semiconductor substrate 10 may comprise a silicon-on-insulator (SOI) substrate, an epitaxial substrate, a SiGe substrate or a SiC substrate. Multiple fins 10 extending along a first direction D1 are formed in the semiconductor substrate 100. The multiple fins 10 comprises a group of active fins 10a, a pair of protection fins 10p sandwiching about the group the active fins 10a, and dummy fins 10d around the pair of protection fins 10p. The fins 10 are formed of an upper portion of the semiconductor substrate 100 and are therefore semiconductor fins. Three-dimensional (3D) finFET devices (not shown) may be formed in the active fins 10a in the later stages.

For the sake of simplicity, only four consecutive active fins 10a, two protection fins 10p and two dummy fins 10d are shown in the figures. However, it is to be understood that the number of the active fins 10a, protection fins 10p and dummy fins 10d may vary according to the circuit design requirements. According to one embodiment, the fins 10 may be formed by using lithographic processes and etching processes, but is not limited thereto. For example, the fins 10 may be formed by using a self-aligned double patterning (SADP) process or any suitable patterning methods known in the art. According to one embodiment, the fins 10 may be in parallel to one another and may be arranged at a fixed pitch. According to one embodiment, trenches 11 extending along the first direction D1 are formed between the fins 10.

According to one embodiment, each of the multiple fins 10 may comprise a pad oxide layer 101, a pad nitride layer 102 on the pad oxide layer 101, and a hard mask layer 103 on the pad nitride layer 102. According to one embodiment, the pad oxide layer 101 may comprise silicon oxide, but is not limited thereto. According to one embodiment, the pad nitride layer 102 may comprise silicon nitride, but is not limited thereto. According to one embodiment, the hard mask layer 103 may comprise silicon oxide, but is not limited thereto.

Figure 2:
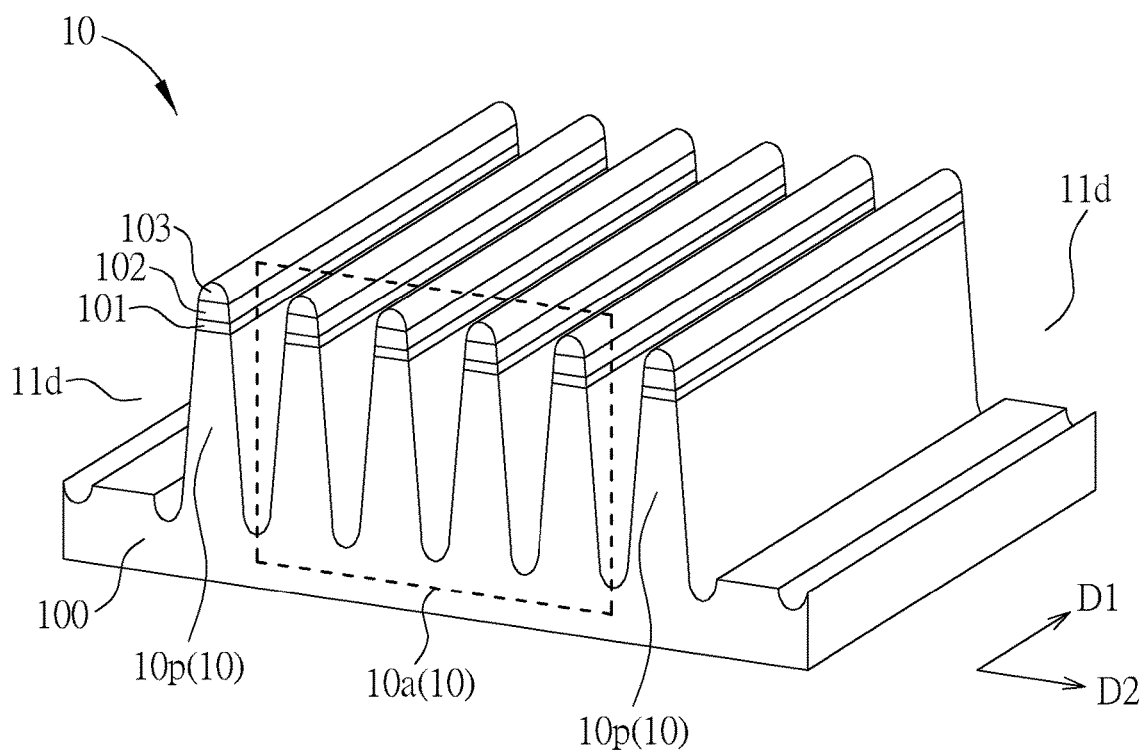

As shown in FIG. 2, after forming the multiple fins 10, a fin cut process is performed. The fin cut process may include lithographic processes and etching processes. For example, a photoresist pattern (not shown) is formed on the semiconductor substrate 100 to cover the active fins 10a, a pair of protection fins 10p sandwiching about the group the active fins 10a and the protection fins 10p. The dummy fins 10d are not covered by the photoresist pattern and are exposed. The exposed dummy fins 10d may be etched by using an anisotropic dry etching process. After removing the dummy fins 10d, a widened trench 11d is formed around the pair of protection fins 10p.

Figure 3:
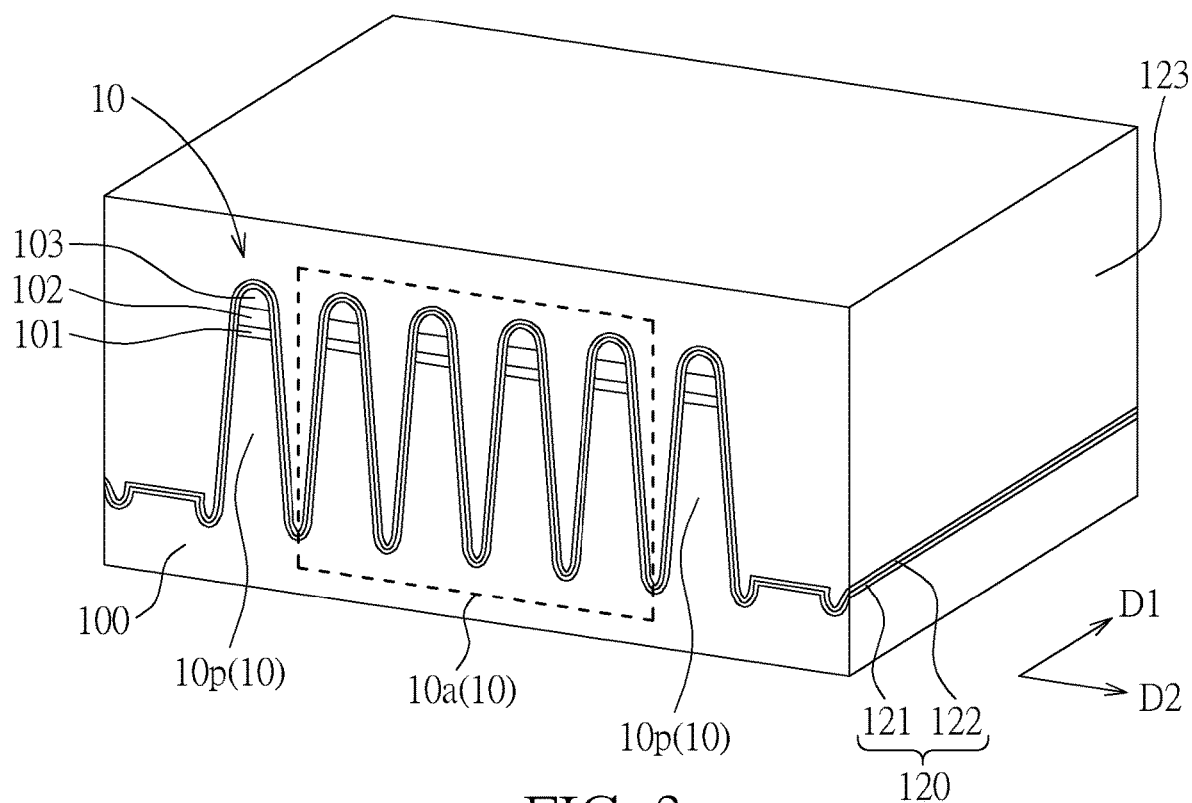
Figure 4:
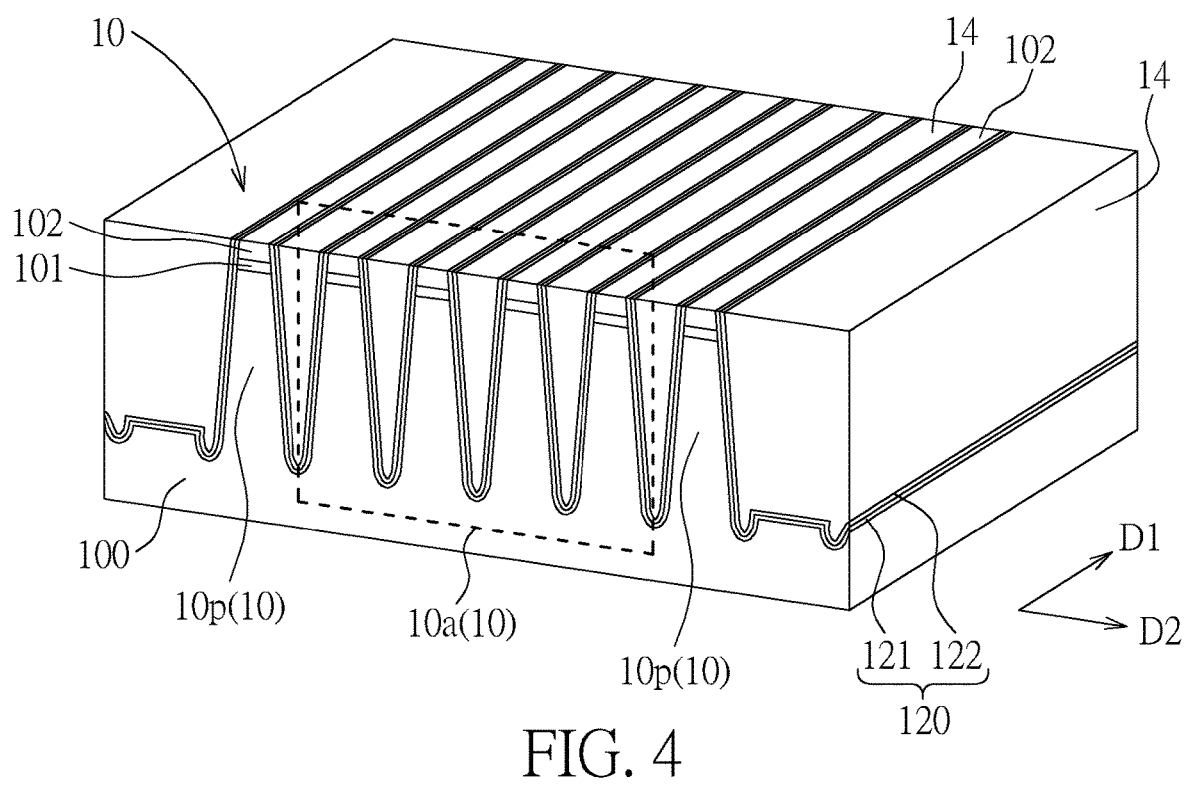

As shown in FIG. 3 and FIG. 4, after performing the fin cut process, trench isolation structures are formed within the trenches 11 between the multiple fins and within the widened trench 11d. As shown in FIG. 3, according to one embodiment, for example, a liner layer 120 is conformally deposited on the multiple fins 10 including the active fins 10a and the protection fins 10p. For example, the liner layer 120 may comprise an in-situ steam growth (ISSG) oxide layer 121 and an atomic layer deposition (ALD) oxide layer 122. Subsequently, a trench-fill oxide layer 123 is deposited on the liner layer 120. The trench 11 and the widened trench 11d are filled up with the trench-fill oxide layer 123.

As shown in FIG. 4, after depositing the trench-fill oxide layer 123 on the liner layer 120, a chemical mechanical polishing (CMP) process is then performed to polish the trench-fill oxide layer 123, the liner layer 120, and the hard mask layer 103 until the pad nitride layer 102 is exposed, thereby forming the trench isolation structures 14. In order to improve the quality of the trench isolation structures 14, an anneal process is then performed. During the anneal process, the protection fins 10p protect the active fins 10a from fin damage, bending or cracking due to stresses exerted on the fins.

Figure 5:
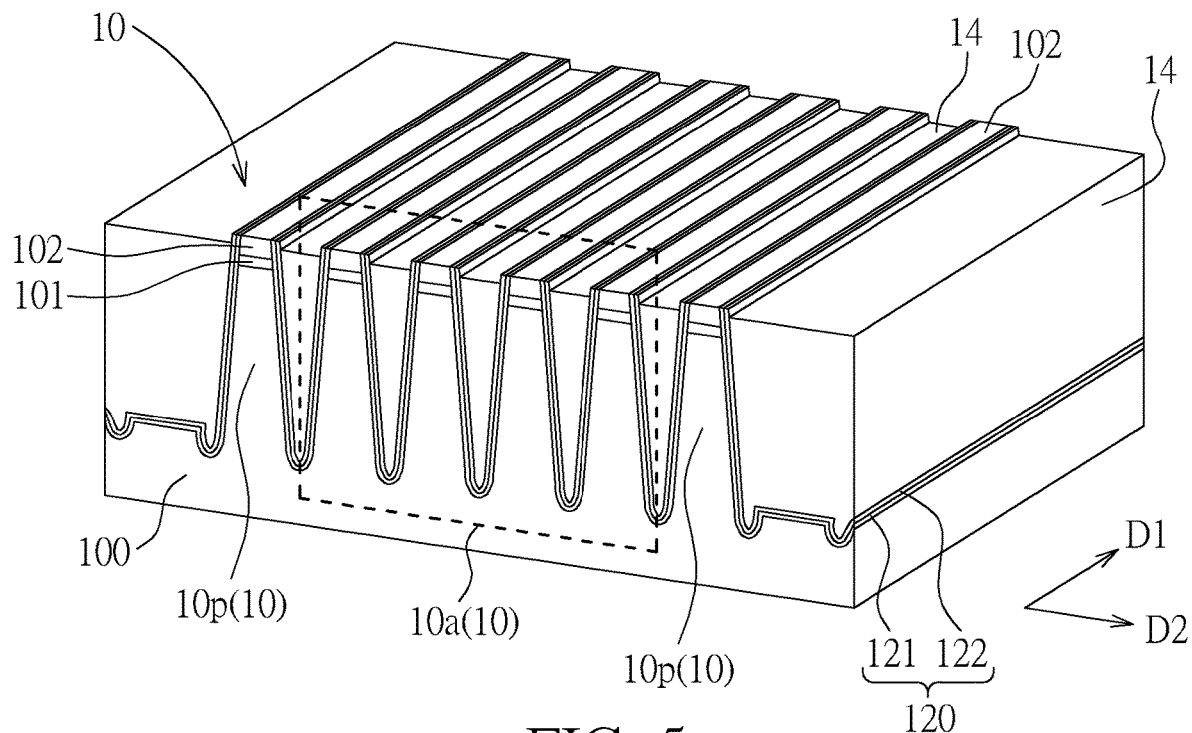
Figure 6:
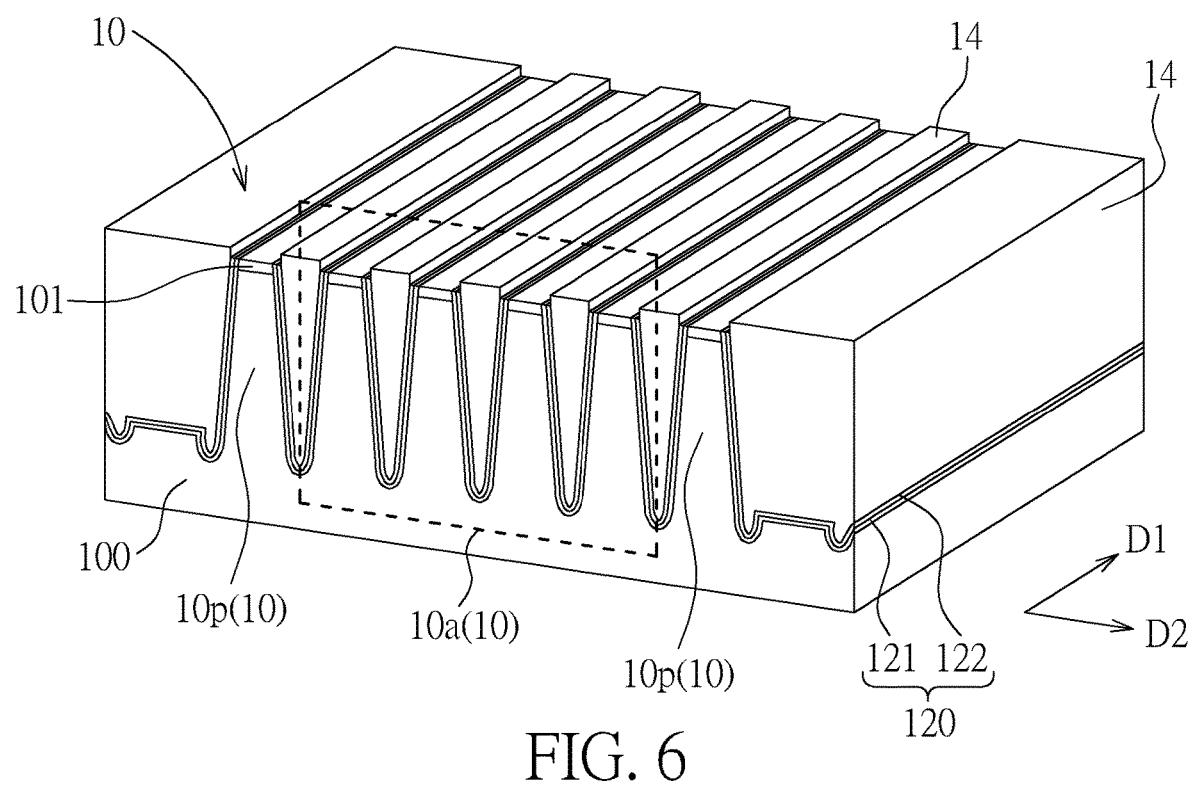

As shown in FIG. 5, after annealing the trench isolation structures 14, a chemical oxide removal (COR) process is then performed to remove (or recess) an upper portion of the trench isolation structures 14. The COR process is a gaseous process known in the art to selectively remove silicon oxides by reacting gaseous ammonia ("$NH_3$") and hydrogen fluoride ("HF") to produce $NH_4F_x$. The $NH_3$ and HF react with silicon oxide on a semiconductor wafer to form ammonium hexafluorosilicate ("$(NH_4)_2SiF_6$"). After performing the COR process to remove an upper portion of the trench isolation structures, the pad nitride layer 102 is then removed from each of the active fins 10a and the protection fins 10p. The pad oxide layer 101 underneath the pad nitride layer 102 is exposed.

Figure 7:
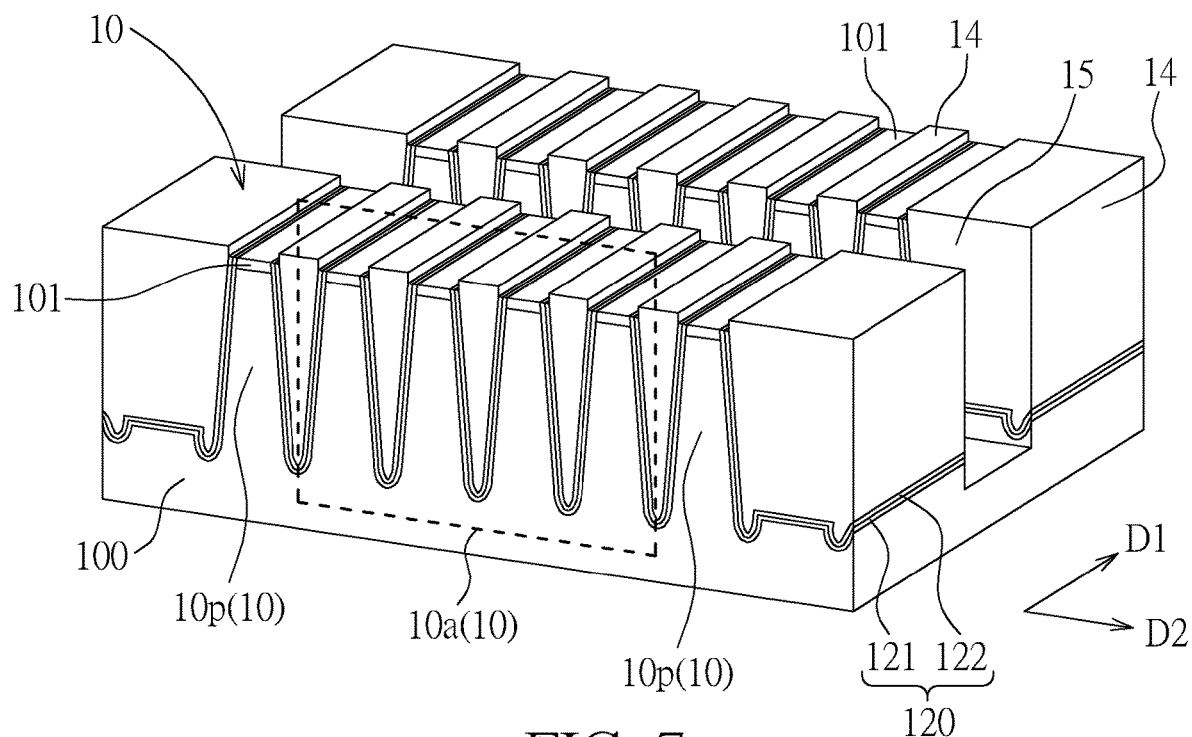

As shown in FIG. 7, after removing the pad nitride layer 102, a single diffusion break (SDB) process is then performed to form a SDB trench 15 in the semiconductor substrate 100. The SDB trench 15 extends along a second direction D2 such that the group of active fins 10a and the pair of protection fins 10p are cut by the SDB trench 15. According to one embodiment, the first direction D1 is perpendicular to the first direction D2. The detailed process steps of the SDB process is not described for the sake of simplicity. For example, the SDB process may involve a lithographic process and a dry etching process.

Figure 8:
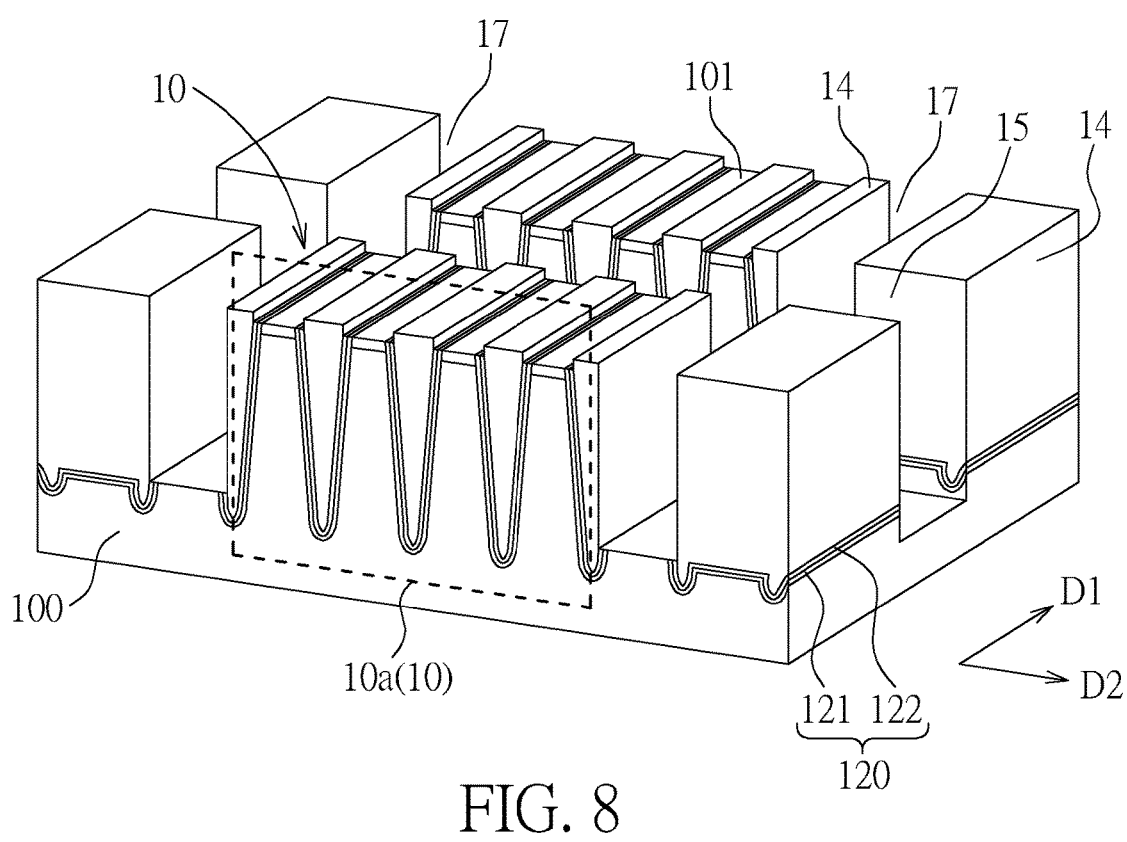

As shown in FIG. 8, after the SDB process is completed, the pair of protection fins 10p is removed, leaving the active fins 10a intact. According to one embodiment, the removal of the protection fins 10p may involves a lithographic process and a dry etching process. For example, a photoresist pattern (not shown) is formed on the semiconductor substrate 100. The photoresist pattern has openings (not shown) extending along the first direction D1. The openings of the photoresist pattern are aligned with the protection fins 10p, respectively. The protection fins 10p are then etched away through the openings of the photoresist pattern. The remaining photoresist pattern is then stripped off. After the protection fins 10p are removed, trenches 17 extending along the first direction D1 are formed. The trenches 17 intersect the SDB trench 15.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:
   forming multiple fins extending along a first direction in a semiconductor substrate, the multiple fins comprising a group of active fins, a pair of protection fins sandwiching about the group the active fins, and at least one dummy fin around the pair of protection fins;
   performing a fin cut process to remove the at least one dummy fin around the pair of protection fins;
   after performing the fin cut process, forming trench isolation structures within the trenches between the multiple fins;
   annealing the trench isolation structures; and
   after annealing the trench isolation structures, removing the pair of protection fins.

2. The method according to claim 1, wherein the multiple fins are semiconductor fins.

3. The method according to claim 1, wherein each of the multiple fins comprises a pad oxide layer, a pad nitride layer on the pad oxide layer, and a hard mask layer on the pad nitride layer.

4. The method according to claim 3, wherein said forming trench isolation structures within the trenches between the multiple fins comprises:
   depositing a liner layer on the multiple fins; and
   depositing a trench-fill oxide layer on the liner layer.

5. The method according to claim 4, wherein the liner layer comprises an in-situ steam growth (ISSG) oxide layer and an atomic layer deposition (ALD) oxide layer.

6. The method according to claim 4, wherein after depositing the trench-fill oxide layer on the liner layer, the method further comprises:
   performing a chemical mechanical polishing (CMP) process to polish the trench-fill oxide layer, the liner layer, and the hard mask layer until the pad nitride layer is exposed.

7. The method according to claim 3, wherein after annealing the trench isolation structures, the method further comprises:
   performing a chemical oxide removal (COR) process to remove an upper portion of the trench isolation structures.

8. The method according to claim 7, wherein after performing the COR process to remove an upper portion of the trench isolation structures, the method further comprises:
   removing the pad nitride layer.

9. The method according to claim 8, wherein after removing the pad nitride layer, the method further comprises:

performing a single diffusion break (SDB) process to form a SDB trench in the semiconductor substrate, wherein the SDB trench extends along a second direction such that the group of active fins and the pair of protection fins are cut by the SDB trench.

10. The method according to claim 9, wherein the first direction is perpendicular to the first direction.

11. The method according to claim 9, wherein after performing the SDB process, the method further comprises:
removing the pair of protection fins.

* * * * *